(12) United States Patent
Koga (10) Patent No.: US 8,188,519 B2
(45) Date of Patent: May 29, 2012

(54) SOLID-STATE IMAGING DEVICE, DRIVE METHOD OF SOLID-STATE IMAGING DEVICE, AND IMAGING APPARATUS

(75) Inventor: Fumihiko Koga, Kanagawa (JP)

(73) Assignee: Sony Corporation, Tokyo (JP)

( * ) Notice: Subject to any disclaimer, the term of this patent is extended or adjusted under 35 U.S.C. 154(b) by 836 days.

(21) Appl. No.: 11/512,006

(22) Filed: Aug. 29, 2006

(65) Prior Publication Data

US 2007/0051988 A1     Mar. 8, 2007

(30) Foreign Application Priority Data

Sep. 2, 2005    (JP) ................. 2005-254682

(51) Int. Cl.
*H01L 29/68* (2006.01)
(52) U.S. Cl. ........ 257/239; 257/214; 257/223; 257/233; 257/E27.132; 257/E27.139; 348/308; 348/310
(58) Field of Classification Search .................. 257/239, 257/214, 223, 233, E27.132, E27.139; 348/308, 348/310
See application file for complete search history.

(56) References Cited

U.S. PATENT DOCUMENTS 6,975,357 B1 * 12/2005 Suzuki et al. ................. 348/308
2004/0130641 A1 * 7/2004 Mabuchi ...................... 348/302

FOREIGN PATENT DOCUMENTS

| JP | 2001-69408 | 3/2001 |
| JP | 2004-129015 | 4/2004 |

* cited by examiner

*Primary Examiner* — Junghwa M Im
(74) *Attorney, Agent, or Firm* — Robert J. Depke; Rockey, Depke & Lyons, LLC (57) ABSTRACT

A solid-state imaging device that includes: a pixel array section configured by an array of a unit pixel, including an optoelectronic conversion section that subjects an incoming light to optoelectronic conversion and stores therein a signal charge, a transfer transistor that transfers the signal charge stored in the optoelectronic conversion section, a charge-voltage conversion section that converts the signal charge provided by the transfer transistor into a signal voltage, and a reset transistor that resets a potential of the charge-voltage conversion section; and voltage setting means for setting a voltage of a well of the charge-voltage conversion section to be negative.

11 Claims, 5 Drawing Sheets

FIG. 3A
RESET-ON

FIG. 3B
RESET-OFF

FIG. 3C
DURING TRANSFER

FIG. 3D
AFTER TRANSFER

FIG. 4A
RESET-ON

FIG. 4B
RESET-OFF

FIG. 4C
PUT WELL POTENTIAL BACK

FIG. 4D
DURING TRANSFER

FIG. 4E
AFTER TRANSFER

FIG. 5

SOLID-STATE IMAGING DEVICE, DRIVE METHOD OF SOLID-STATE IMAGING DEVICE, AND IMAGING APPARATUS

CROSS REFERENCES TO RELATED APPLICATIONS

The present invention contains subject matter related to Japanese Patent Application JP 2005-254682 filed in the Japanese Patent Office on Sep. 2, 2005, the entire contents of which being incorporated herein by reference.

BACKGROUND OF THE INVENTION

1. Field of the Invention

The present invention relates to solid-state imaging devices, drive methods of solid-state imaging devices, and imaging apparatuses and, more specifically, to a solid-state imaging device of amplifier type in which unit pixels each including an optoelectronic conversion element have an amplification capability, a drive method of the solid-state imaging device, and an imaging apparatus using the solid-state imaging device.

2. Description of the Related Art

The development of solid-state imaging devices of amplifier type typified by CMOS (Complementary Metal Oxide Semiconductor) image sensors has recently become active. For the solid-state imaging device of this type, (e.g., refer to Patent Document 1 (JP-A-2001-69408)), reduction of the power supply voltage is promoted with the relaxation of a design rule for MOS (Metal Oxide Semiconductor). This resultantly reduces a reset voltage for use of resetting the potential of a floating diffusion section, i.e., charge-voltage conversion section, in a unit pixel.

In the solid-state imaging devices, in view of increasing an SN (Signal-to-Noise) ratio, it is originally considered advantageous if signal amplification is performed before the stage of a signal processing system. For the aim of deriving a satisfactory SN ratio, it is thus desirable that the floating diffusion section is reduced in capacity, and the conversion efficiency is increased at the time of converting a signal charge into a signal voltage.

SUMMARY OF THE INVENTION

The issue here is that if the conversion efficiency is increased for the floating diffusion section, i.e., if the floating diffusion section is reduced in capacity, the sensitivity (sensor sensitivity) is resultantly increased for imaging. This causes a problem of, when an intense light enters an imaging surface of the solid-state imaging device, failing to completely transfer to the floating diffusion section a signal charge to be stored in an optoelectronic conversion section. With any remaining signal charge failed to be transferred to the floating diffusion section, an afterimage or others will be resultantly caused so that the image quality is unfavorably degraded.

Assuming that the signal charge is completely transferred from the optoelectronic conversion section to the floating diffusion section, if an amplifier transistor is operated as a source follower, the voltage will be excessively low for application to a gate of the amplifier transistor. This prevents a drain of a constant-current power supply (transistor) from receiving an enough voltage. The constant-current power supply is the one to be disposed on the side of a source of the amplifier transistor. With this being the case, the constant-current power supply is not able to operate satisfactorily, thereby resulting in adverse effects, e.g., the source follower is reduced in linearity.

For measures against such a problem, if saturation signals are increased in amount in the optoelectronic conversion section, this easily causes transfer failures. It thus has been previously difficult to increase the dynamic range and the SN ratio at the same time.

It is thus desirable to provide a solid-state imaging device, a drive method of the solid-state imaging device, and an imaging apparatus, all of which enable to increase a dynamic range by completing signal charge transfer with no charge left even when a large amount of signal charge is stored in an optoelectronic conversion section due to a large amount of incoming light.

It is also desirable to provide a solid-state imaging device, a drive method of the solid-state imaging device, and an imaging apparatus, all of which enable to increase an SN ratio by outputting a signal as a result of charge-voltage conversion with a high amplification ratio.

According to a first embodiment of the present invention, there is provided a solid-state imaging device configured by an array of pixels, each including an optoelectronic conversion section that subjects an incoming light to optoelectronic conversion and stores therein a signal charge, a transfer transistor that transfers the signal charge stored in the optoelectronic conversion section, a charge-voltage conversion section that converts the signal charge provided by the transfer transistor into a signal voltage, and a reset transistor that resets the potential of the charge-voltage conversion section. In the solid-state imaging device, the voltage of a well of the charge-voltage conversion section is set to be negative.

In the solid-state imaging device configured as such, the voltage of the well of the charge-voltage conversion section is set to be negative so that the potential difference between the optoelectronic conversion section and the charge-voltage conversion section can be increased. This favorably enables to perform signal charge transfer from the optoelectronic conversion section to the charge-voltage conversion section with no charge left even when a large amount of signal charge is stored in the optoelectronic conversion section due to a large amount of incoming light.

According to a second embodiment of the invention, there is provided a solid-state imaging device configured by an array of pixels, each including an optoelectronic conversion section that subjects an incoming light to optoelectronic conversion and stores therein a signal charge, a transfer transistor that transfers the signal charge stored in the optoelectronic conversion section, a charge-voltage conversion section that converts the signal charge provided by the transfer transistor into a signal voltage, a reset transistor that resets the potential of the charge-voltage conversion section, and an amplifier transistor that receives an input of a signal of the charge-voltage conversion section. In such a solid-state imaging device, when the amplifier transistor outputs the signal of the charge-voltage conversion section, the voltage of the well is set to be higher than a reset voltage of the charge-voltage conversion section.

In the solid-state imaging device configured as such, when the amplifier transistor outputs the signal of the charge-voltage conversion section, the voltage of the well of the charge-voltage conversion section is set to be higher than the voltage when the charge-voltage conversion section is reset. This favorably enables to output the signal as a result of charge-voltage conversion with a high amplification ratio.

According to the embodiments of the invention, the voltage of the well of the charge-voltage conversion section is set to be negative. This favorably enables to perform signal charge transfer from the optoelectronic conversion section to the charge-voltage conversion section with no charge left even when a large amount of signal charge is stored in the optoelectronic conversion section due to a large amount of incoming light so that a dynamic range can be accordingly increased.

Moreover, according to the embodiments of the invention, when the amplifier transistor outputs the signal of the charge-voltage conversion section, the voltage of the well of the charge-voltage conversion section is set to be higher than a reset voltage of the charge-voltage conversion section. This accordingly enables to increase the SN ratio because the signal as a result of charge-voltage conversion can be output with a high amplification ratio.

DETAILED DESCRIPTION OF THE INVENTION

In the below, an embodiment of the invention is described in detail by referring to the accompanying drawings.

Figure 1:
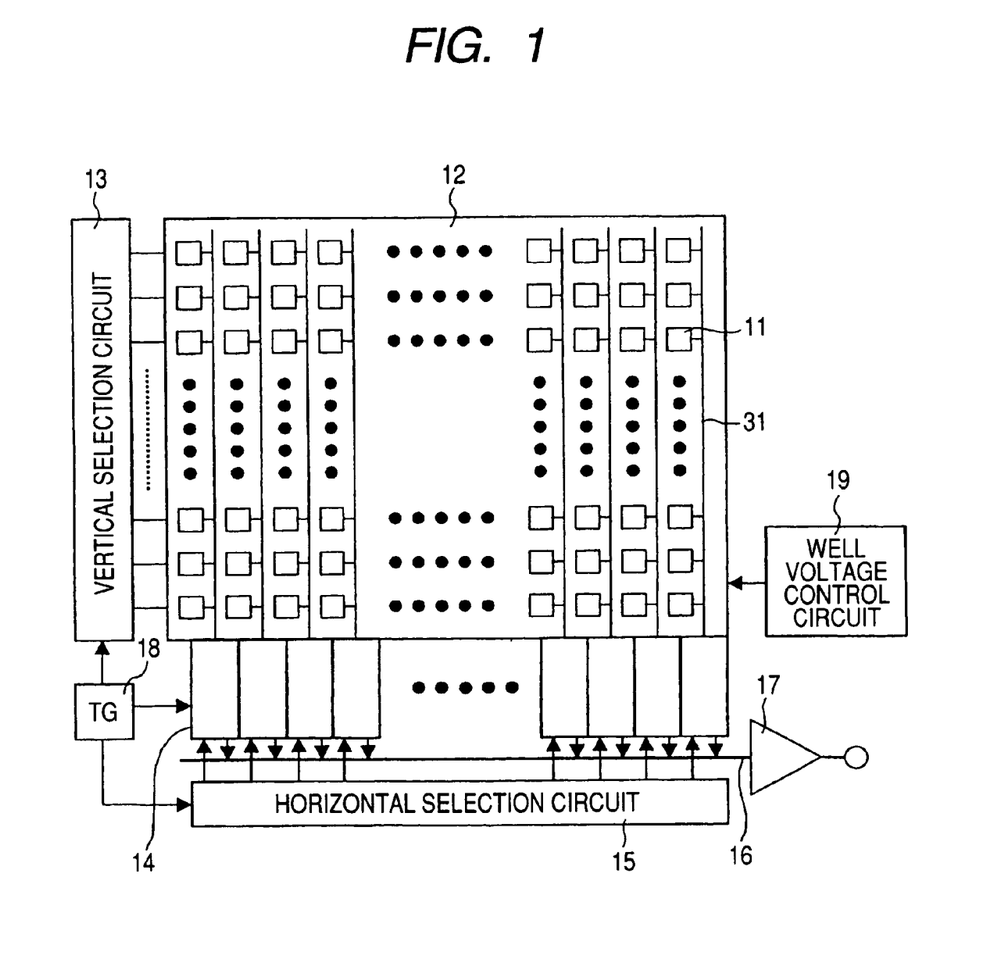
FIG. 1 is a block diagram showing an exemplary configuration of a CMOS image sensor of an embodiment of the invention.

FIG. 1 is a block diagram showing an exemplary configuration of a solid-state imaging device of amplifier type in the embodiment of the invention, e.g., exemplary configuration of a CMOS image sensor.

As shown in FIG. 1, a CMOS image sensor 10 of this embodiment is of an area sensor configuration, including a unit pixel 11, a pixel array section (imaging area) 12, a vertical selection circuit 13, a column circuit 14 being a column parallel signal processing circuit, a horizontal selection circuit 15, a horizontal signal line 16, an output circuit 17, a timing generator (TG) 18, a well voltage control circuit 19, or others. The unit pixel 11 includes an optoelectronic conversion section, e.g., photo diode.

The specific circuit configuration of the unit pixel 11 will be described later in detail. The pixel array section 12 includes therein a plurality of unit pixels 11 in two-dimensional matrix, and for every pixel column of the two-dimensional matrix, a vertical signal line 31 is wired, and for every pixel line thereof, a control line that will be described later (e.g., a transfer line 32 or a reset line 34 of FIG. 2) is wired. At each end of the vertical signal lines 31, a constant-current power source 35 exemplified by a MOS transistor is connected (refer to FIG. 2).

The vertical selection circuit 13 is configured by a shift register, an address decoder, or others, and sequentially outputs a control signal on a line basis so as to select and drive the pixels 11 in the pixel array section 12 on a line basis. Herein, the control signal includes a transfer signal that drives a transfer register in the unit pixel 11, a reset signal that drives a reset transistor, or others.

The column circuit 14 is a column parallel signal processing circuit that is disposed for every group of pixels of the pixel array section 12 in the horizontal direction, i.e., for every vertical signal line 31, and performs predetermined signal processing in parallel for every pixel line. For example, the column circuit 14 is configured by an S/H (Sample-and-Hold) circuit, a CDS (Correlated Double Sampling) circuit, or others.

The horizontal selection circuit 15 is configured by a shift register or others, and outputs a signal of each of the pixels 11 to the horizontal signal line 16 by selective scanning. The signals are those coming in parallel via the column circuit 14 on a line basis, and the selective scanning is performed in a sequential manner via a horizontal selection switch that is disposed for every column. Note here that FIG. 1 shows no horizontal selection switch for brevity. This horizontal selection switch is sequentially driven to be ON and OFF by the horizontal selection circuit 15 on a column basis.

As a result of the selective drive applied by the horizontal selection circuit 15, the signals of the unit pixels 11 sequentially coming from the column circuit 14 on a column basis are supplied to the output circuit 17 via the horizontal signal line 16. The output circuit 17 applies signal processing to the pixel signals coming from over the horizontal signal line 16. The signal processing includes amplification, selection, AGC (Automatic Gain Control), A/D (Analog/Digital) conversion, or others.

The timing generator 18 generates various types of timing signals based on a vertical synchronizing signal, a horizontal synchronizing signal, and a master clock signal. Based on these timing signals varying in type, the timing generator 18 exercises drive control over the vertical selection circuit 13, the column circuit 14, the horizontal selection circuit 15, and others.

The well voltage control circuit 19 is equivalent to the voltage setting means in claims, and controls the voltage of the well of the charge-voltage conversion section in the unit pixel 11 at any arbitrary timing, and sets the voltage of the well to be negative. The embodiment of the invention includes the well voltage control circuit 19 to drive the unit pixels 11, and the drive method will be described later in detail.

Pixel Circuit

Figure 2:
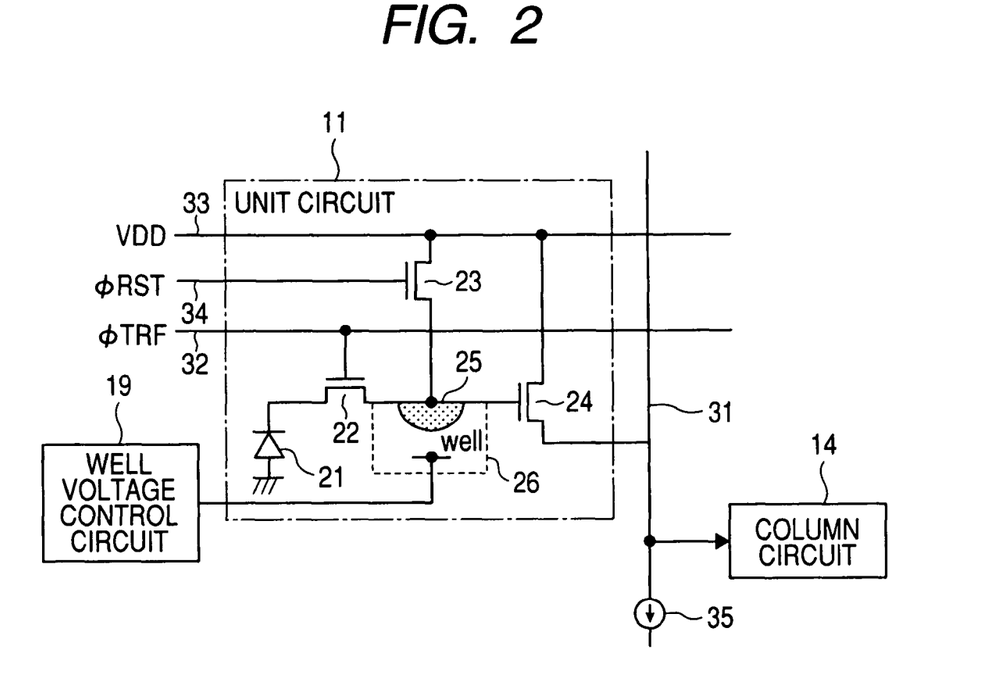
FIG. 2 is a circuit diagram showing an exemplary circuit configuration of a unit pixel.

FIG. 2 is a circuit diagram showing an exemplary circuit configuration of the unit pixel 11. As shown in FIG. 2, the unit pixel 11 of this exemplary circuit includes, in addition to an optoelectronic conversion element, e.g., a photo diode 21, three transistors of a transfer transistor 22, a reset transistor 23, and an amplifier transistor 24. In this example, these transistors 22 to 24 are N-channel MOS transistors, for example.

The photo diode 21 subjects an incoming light to optoelectronic conversion to derive signal charge (electrons in this example) of an amount corresponding to the amount of light, and stores therein the resulting signal charge. The transfer transistor 22 is connected between a cathode of the photo diode 21 and an FD (Floating Diffusion) section 25 being a charge-voltage conversion section. The gate of the transfer transistor 22 is connected to the transfer line 32, and when the gate is provided with a transfer pulse φTRF via the transfer line 32, the signal charge stored in the photo diode 21 is transferred to the FD section 25.

The FD section 25 converts the signal charge provided by the photo diode 21 into a signal voltage. As to the reset transistor 23, a power source line 33 is connected with a drain, the FD section 25 is connected with a source, and the reset line 34 is connected with a gate. Prior to the transfer of the signal charge from the photo diode 21 to the FD section 25, the gate is provided with a reset pulse φRST over the reset line 34 so that the potential of the FD section 25 is reset. The power source line 33 is selectively provided with a VDD level and a GND level as the power source voltage.

The amplifier transistor 24 is of a source follower configuration in which the FD section 25 is connected with a gate, the power source line 33 is connected with a drain, and the vertical signal line 31 is connected with a source. When the power source line 33 is changed in potential to the VDD level, the amplifier transistor 24 is put into an operation state, and performs a selection of the pixels 11. Thereafter, the signal voltage of the FD section 25 after the reset by the reset transistor 23 is forwarded to the vertical signal line 31 as a reset level, and the signal voltage of the FD section 25 after the transfer of the signal charge by the transfer transistor 22 is forwarded to the vertical signal line 31 as a signal level.

Note here that the circuit configuration of the unit pixel 11 is not restrictive to the above configuration, i.e., 3-transistor configuration using the amplifier transistor 24 with the selection transistor. Alternatively, the unit pixel may also take a 4-transistor configuration, e.g., including a selection transistor connected between a drain of the amplifier transistor 24 and the power source line 33, or between a source and the vertical signal line 31.

In the CMOS image sensor including the unit pixels 11 of the above configuration are disposed in a two-dimensional matrix, the well voltage control circuit 19 being the feature of the embodiment of the invention sets the voltage of a well 26 configuring the FD section 25. Such voltage setting is made when the reset transistor 23 resets the potential of the FD section 25 being the charge-voltage conversion section. The well voltage control circuit 19 also sets the voltage of the well 26 to be higher than a reset voltage of the FD section 25 when the amplifier transistor 24 outputs the signal of the FD section 25.

Here, a comparison in terms of drive operation is made between the previous example and the embodiment of the invention, i.e., a case of driving the unit pixels 11 without the well voltage control circuit 19 (previous example), and a case of driving the unit pixels 11 with the well voltage control circuit 19 (embodiment of invention).

By referring to the potential diagrams of FIGS. 3A to 3D, described first is the drive operation in the previous example. With such a drive operation in the previous example, the voltage Vwell of the well 26 is 0V.

Figure 3A:
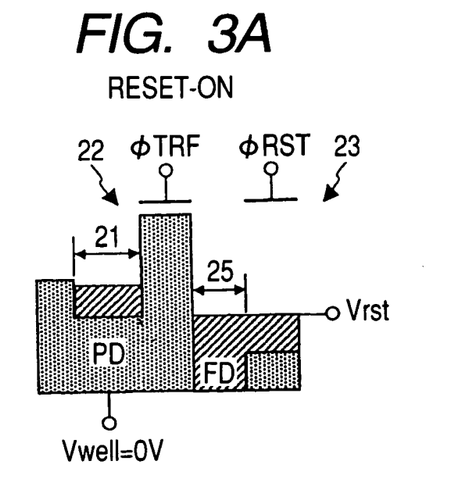
FIGS. 3A to 3D are potential diagrams for illustrating a drive operation in a previous example.

FIG. 3A is a potential diagram at the time of reset-on. That is, the gate of the reset transistor 23 is applied with a reset pulse φRST so that the reset transistor 23 is turned on, and the potential of the FD section 25 is reset. In this state, the FD section 25 is reset by a reset voltage Vrst (VDD level in this example) coming from the power source line 33.

Figure 3B:
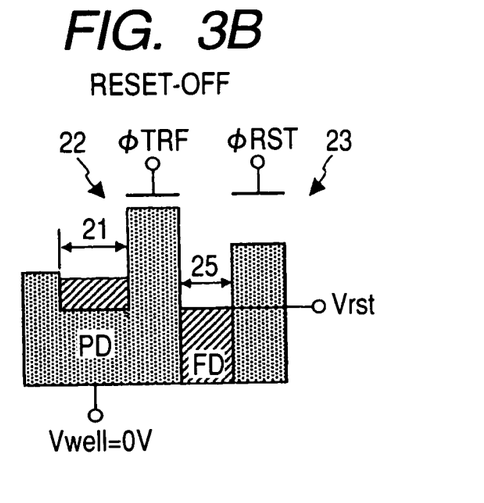

FIG. 3B is a potential diagram at the time of reset-off. That is, when the reset transistor 23 is turned off, the potential below the gate of the reset transistor 23 becomes shallow. The reset voltage Vrst is then output by the amplifier transistor 24 as a reset level.

Figures 3C, 3D:
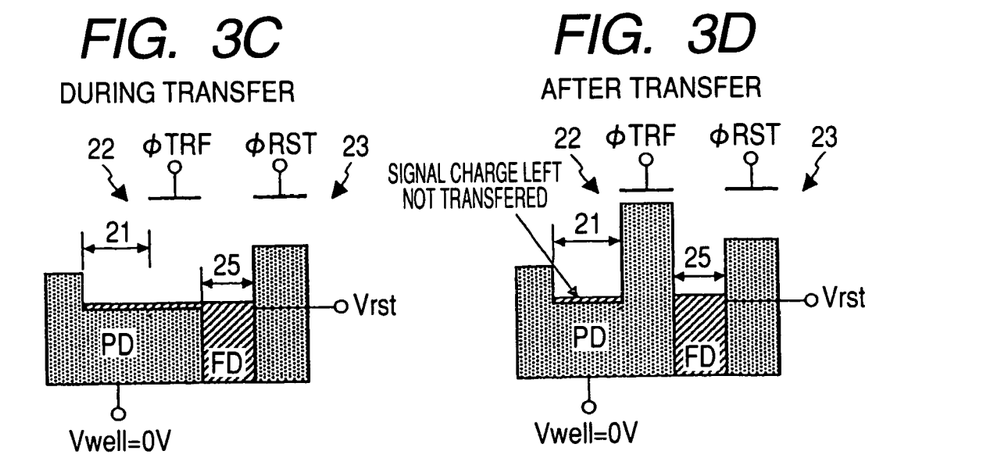

FIG. 3C is a potential diagram at the time of signal charge transfer, i.e., the state in which the transfer transistor 22 is turned on by applying the transfer pulse φTRF to the gate of the transfer transistor 22. When the transfer transistor 22 is turned on, the potential below the gate becomes deep so that the signal charge stored in the photo diode 21 as a result of optoelectronic conversion is transferred to the FD section 25.

FIG. 3D is a potential diagram after the signal charge transfer. That is, when the transfer transistor 22 is turned off, the potential of the FD section 25 will be a voltage corresponding to the amount of the signal charge provided by the photo diode 21. The voltage corresponding to the signal charge is output from the amplifier transistor 24 as a signal level.

Herein, exemplified is a case where the power supply voltage is reduced, and the reset voltage Vrst is being reduced. In such a case, to make the SN ratio satisfactory, the capacity of the FD section 25 is controlled to be small, and the conversion efficiency is increased for a case of converting the signal charge into a signal voltage. This resultantly increases the sensitivity for imaging. Accordingly, when an intense light enters an imaging surface of the solid-state imaging device, as shown in FIG. 3D, the signal charge of the photo diode 21 is not completely transferred to the FD section 25, and a part of the signal charge remains in the photo diode 21. Even if the potential of the photo diode 21 is shallow, and even if the signal charge is completely transferred to the FD section 25, the potential of the FD section 25 becomes considerably shallow.

Described next is a drive operation of the embodiment of the invention by referring to potential diagrams of FIGS. 4A to 4E.

Figure 4A:
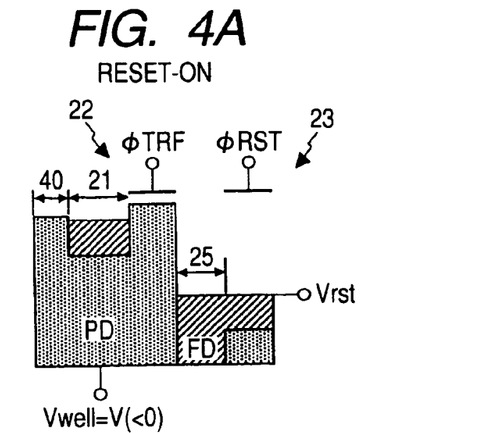
FIGS. 4A to 4E are potential diagrams for illustrating a drive operation in the embodiment of the invention.

FIG. 4A is a potential diagram at the time of reset-on. That is, the well voltage control circuit 19 sets the voltage Vwell of the well 26 to be negative, the gate of the reset transistor 23 is applied with a reset pulse φRST so that the reset transistor 23 is turned on, and the potential of the FD section 25 is reset. At this time, the FD section 25 is reset by a reset voltage Vrst (VDD level in this example) coming from the power supply line 33. Note here that, the negative voltage is arbitrarily determined based on the reset voltage Vrst.

Here, the reset transistor 23 is a depletion transistor. That is, it is preferable to deplete and design a threshold voltage with the consideration given to the voltage of the well 26 with an aim of turning on the reset transistor 23 with a sufficient depth when the negative voltage is applied to the well 26.

Figure 4B:
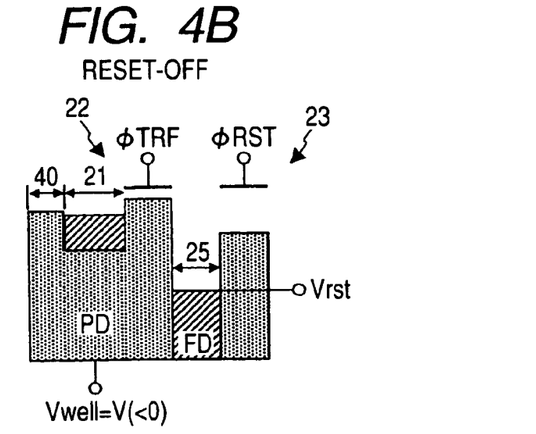

FIG. 4B is a potential diagram at the time of reset-off. That is, when the reset transistor 23 is turned off, the potential below the gate of the reset transistor 23 becomes shallow. The voltage Vwell of the well 26 is also negative at this time. The reset voltage Vrst is then output as a reset level by the amplifier transistor 24.

Figure 4C:
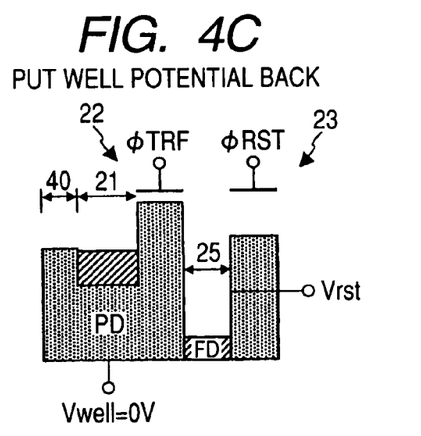

FIG. 4C is a potential diagram when the voltage Vwell of the well 26 is put back to 0V from negative. Because the FD section 25 is in the floating state, putting back the voltage Vwell of the well 26 to 0V will increase the potential of the FD section 25 together with the increase of the voltage Vwell. As a result, the FD section 25 can be reset with a voltage higher than the case of FIG. 3B.

Figure 4D:
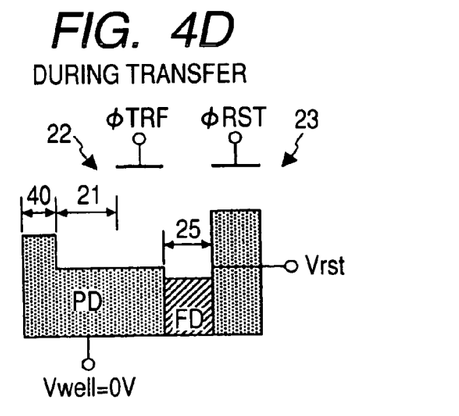

FIG. 4D is a potential diagram at the time of signal charge transfer, i.e., the state in which the gate of the transfer transistor 22 is applied with a transfer pulse φTRF, and the transfer transistor 22 is turned on. When the transfer transistor 22 is turned on, the potential below the gate becomes deep so that the signal charge stored in the photo diode 21 as a result of optoelectronic conversion is transferred to the FD section 25. At this time, because the potential of the FD section 25 is initially high so that no signal charge is left in the photo diode 21 after the signal charge transfer.

Figure 4E:
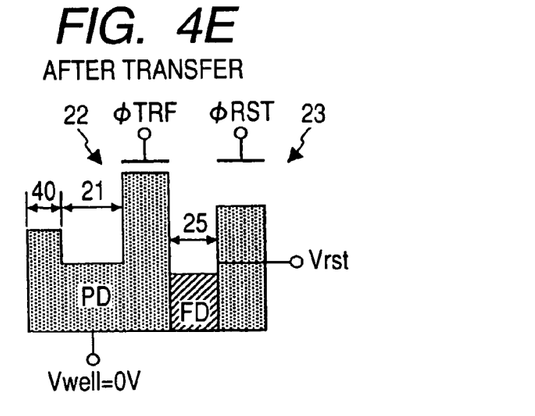

FIG. 4E is a potential diagram after the signal charge transfer. That is, when the transfer transistor 22 is turned off, the potential of the FD section 25 will become a voltage corresponding to the amount of signal charge provided by the photo diode 21. At this time, the potential of the FD section 25 after the signal charge transfer is higher than that when the voltage of the well 26 is not set to be negative, i.e., in the state of FIG. 3D. Therefore, when the potential of the FD section 25 is forwarded by the amplifier transistor 24 as a signal level, the amplifier transistor 24 can amplify the signal with a high amplification ratio.

The reset level output from the unit pixel 11 in the state of FIG. 4C and the signal level output from the unit pixel 11 in the state of FIG. 4E are both supplied to the column circuit 14 via the vertical signal line 31, and are sequentially sampled by a CDS process in the column circuit 14. As such, sampling in the state of FIG. 4C, i.e., the state in which the voltage of the well 26 is stable, eliminates any possible influence of a reset noise caused by the variation of the negative voltage to be applied to the well 26.

The potential barrier below the gate of the transfer transistor 22 is designed so as to be much higher than an overflow path of the photo diode 21, specifically as shown in FIG. 4A, than an n-type signal charge storage area of the photo diode 21, and a p-type overflow barrier area 40 formed to an n-type substrate (or n well) therebelow. With such a configuration, even if the well 26 is applied with a negative voltage, the signal charge stored in the photo diode 21 is not overflowed from below the gate of the transfer transistor 22 so that the reduction of the saturation signal can be successfully prevented.

When the overflow path is mainly found below the gate of the transfer transistor 22, when the voltage of the well 26 is changed to be negative, the voltage to be applied to the gate of the transfer transistor 22, i.e., the voltage of the transfer pulse φTRF, is also reduced to the same level so that the relative potential difference can be reserved between the transfer path of the signal charge and the overflow path. This thus enables to prevent the saturation signal from being reduced.

Application Example

The solid-state imaging device of the above embodiment is suitable if used as an imaging unit for an imaging apparatus such as digital still camera or video camera.

Herein, the imaging apparatus includes a solid-state imaging device as an imaging unit, a camera module including an optical system that forms an image of an object on an imaging surface of the solid-state imaging device, and a signal processing circuit of the solid-state imaging device, and a camera system, e.g., digital still camera or video camera, equipped with the camera module. Herein, the camera module is equipped, for use, to electronic equipment such as mobile phones.

Figure 5:
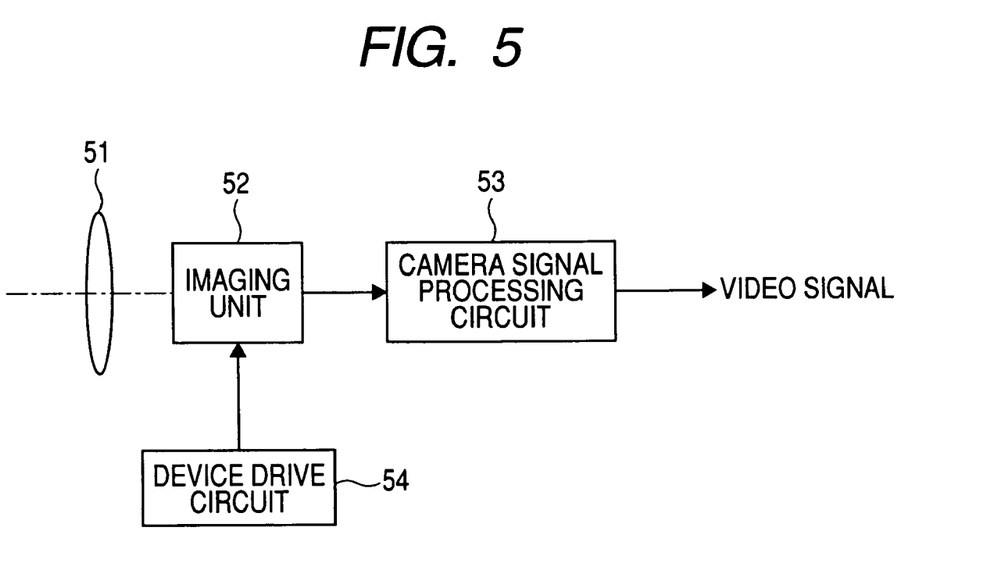
FIG. 5 is a block diagram showing an exemplary configuration of an imaging apparatus in the embodiment of the invention.

FIG. 5 is a block diagram showing an exemplary configuration of the imaging apparatus of an embodiment of the invention. As shown in FIG. 5, the imaging apparatus of this embodiment is configured to include an optical system including a lens 51, an imaging unit 52, a camera signal processing circuit 53, a device drive circuit 54, and others.

The optical system including the lens 51 forms an image of an object on an imaging surface of the imaging unit 52. The imaging unit 52 is under the drive control of the device drive circuit 54, and outputs an image signal as a result of converting the image formed by the lens 51 on the imaging surface into an electric signal on a pixel basis. Used as this imaging unit 52 is the above-described solid-state imaging device of the embodiment, i.e., a CMOS image sensor. The camera signal processing section 53 applies predetermined signal processing to the image signal provided by the imaging unit 52.

The device drive circuit 54 is configured by a timing generation circuit 18, a well potential control circuit 19, or others of FIG. 1. When the unit pixels are driven, the device drive circuit 54 is put under the control of the well potential control circuit 19. For example, when the reset transistor resets the potential of the charge-voltage conversion section, the voltage of the well of the charge-voltage conversion section is set to be negative, and when a signal of the charge-voltage conversion section is output by the amplifier transistor, the voltage of the well is set to be higher than the voltage of the charge-voltage conversion section when it is reset.

As described in the foregoing, in the imaging apparatus such as digital still camera, video camera, or others, using the CMOS image sensor of the above-described embodiment as an imaging unit will lead to the effects as below.

That is, with the CMOS image sensor, in the circumstances that the power supply voltage is reduced and the reset voltage is being reduced, to make the SN ratio satisfactory, the capacity of the FD section 25 is controlled to be small, and the conversion efficiency is increased for the case of converting the signal charge into a signal voltage. In such a case, even if a large amount of signal charge is stored in an optoelectronic conversion section due to a large amount of incoming light, a dynamic range can be increased by completing signal charge transfer with no charge left. What is more, by outputting a signal as a result of charge-voltage with a high amplification ratio, the SN ratio can be increased so that the resulting captured image can be high in image quality.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
    a pixel array section including an array of a unit pixels, each pixel including an optoelectronic conversion section that performs optoelectronic conversion on incoming light and stores a signal charge, a transfer transistor that transfers the signal charge stored by the optoelectronic conversion section, a charge-voltage conversion section that converts the signal charge provided by the transfer transistor into a signal voltage, and a reset transistor that resets a potential of the charge-voltage conversion section; and
    a voltage setting unit for setting a voltage of a well of the charge-voltage conversion section to be negative when the reset transistor resets a potential of the charge-voltage conversion section, and wherein the voltage of the well of the charge converting section is set to be greater than a negative voltage after the reset operation and during and after a transfer operation.

2. The solid-state imaging device according to claim 1, wherein the reset transistor is a depletion transistor.

3. The solid-state imaging device according to claim 1, wherein
    a potential barrier below a gate of the transfer transistor is higher than an overflow path of the optoelectronic conversion section.

4. The solid-state imaging device according to claim 1, further comprising
    means for reducing a voltage to be applied to a gate of the transfer transistor when the voltage setting means sets the voltage of the well to be negative.

5. The solid-state imaging device according to claim 1, wherein
    the unit pixel further includes an amplifier transistor that receives an input of a signal of the charge-voltage conversion section, and
    when the amplifier transistor outputs the signal of the charge-voltage conversion section, the voltage setting means sets the voltage of the well to be higher than a reset voltage of the charge-voltage conversion section.

6. A solid-state imaging device, comprising:
a pixel array section including an array of a unit pixels, each pixel including an optoelectronic conversion section that performs optoelectronic conversion on incoming light and stores a signal charge, a transfer transistor that transfers the signal charge stored by the optoelectronic conversion section, a charge-voltage conversion section that converts the signal charge provided by the transfer transistor into a signal voltage, a reset transistor that resets a potential of the charge-voltage conversion section, and an amplifier transistor that receives an input of a signal of the charge-voltage conversion section; and
voltage setting unit for setting, when the amplifier transistor outputs the signal of the charge-voltage conversion section, a voltage of a well to be higher than a reset voltage of the charge-voltage conversion section; and wherein the voltage setting unit sets the voltage of the well to be negative when the reset transistor resets the potential of the charge-voltage conversion section, and wherein the voltage of the well of the charge converting section is set to be greater than a negative voltage after the reset operation and during and after a transfer operation.

7. A drive method for driving a solid-state imaging device, the imaging device including: a pixel array section including an array of unit pixels, each unit pixel including an optoelectronic conversion section that performs optoelectronic conversion on incoming light and stores a signal charge, a transfer transistor that transfers the signal charge stored by the optoelectronic conversion section, a charge-voltage conversion section that converts the signal charge provided by the transfer transistor into a signal voltage, and a reset transistor that resets a potential of the charge-voltage conversion section, the method comprising:
setting a voltage of a well to be negative when the reset transistor resets a potential of the charge-voltage conversion section, and
transferring the signal charge from the optoelectronic conversion section to the charge-voltage conversion section, wherein the voltage of the well of the charge converting section is set to be greater than a negative voltage after the reset operation and during and after a transfer operation.

8. A drive method for driving a solid-state imaging device, the imaging device including: a pixel array section including an array of a unit pixels, each unit pixel including an optoelectronic conversion section that performs optoelectronic conversion on incoming light and stores a signal charge, a transfer transistor that transfers the signal charge stored by the optoelectronic conversion section, a charge-voltage conversion section that converts the signal charge provided by the transfer transistor into a signal voltage, a reset transistor that resets a potential of the charge-voltage conversion section, and an amplifier transistor that receives an input of a signal of the charge-voltage conversion section, the method comprising:
setting a voltage of a well to be higher than a reset voltage of the charge-voltage conversion section when the amplifier transistor outputs the signal of the charge-voltage conversion section; and wherein a voltage setting unit sets the voltage of the well to be negative when the reset transistor resets the potential of the charge-voltage conversion section, and wherein the voltage of the well of the charge converting section is set to be greater than a negative voltage after the reset operation and during and after a transfer operation.

9. An imaging apparatus, comprising:
a solid-state imaging device; and
an optical system that guides a light from an object onto an imaging surface of the solid-state imaging device, wherein
the solid-state imaging device includes:
a pixel array of unit pixels, each unit pixel including an optoelectronic conversion section that performs optoelectronic conversion on incoming light and stores a signal charge, a transfer transistor that transfers the signal charge stored by the optoelectronic conversion section, a charge-voltage conversion section that converts the signal charge provided by the transfer transistor into a signal voltage, and a reset transistor that resets a potential of the charge-voltage conversion section; and
voltage setting unit for setting a voltage of a well of the charge-voltage conversion section to be negative when the reset transistor resets a potential of the charge-voltage conversion section, and wherein the voltage of the well of the charge converting section is set to be greater than a negative voltage after the reset operation and during and after a transfer operation.

10. An imaging apparatus, comprising:
a solid-state imaging device; and
an optical system that guides a light from an object onto an imaging surface of the solid-state imaging device, wherein
the solid-state imaging device includes:
a pixel array of unit pixels, each unit pixel including an optoelectronic conversion section that performs optoelectronic conversion on incoming light and stores a signal charge, a transfer transistor that transfers the signal charge stored by the optoelectronic conversion section, a charge-voltage conversion section that converts the signal charge provided by the transfer transistor into a signal voltage, a reset transistor that resets a potential of the charge-voltage conversion section, and an amplifier transistor that receives an input of a signal of the charge-voltage conversion section; and
voltage setting unit for setting a voltage of a well to be higher than a reset voltage of the charge-voltage conversion section when the amplifier transistor outputs the signal of the charge-voltage conversion section; and wherein the voltage setting unit sets the voltage of the well to be negative when the reset transistor resets the potential of the charge-voltage conversion section, and the voltage of the well of the charge converting section is set to be greater than a negative voltage after the reset operation and during and after a transfer operation.

11. A solid-state imaging device, comprising:
a pixel array of unit pixels, each unit pixel including an optoelectronic conversion section that performs optoelectronic conversion and stores a signal charge, a transfer transistor that transfers the signal charge stored by the optoelectronic conversion section, a charge-voltage conversion section that converts the signal charge provided by the transfer transistor into a signal voltage, and a reset transistor that resets a potential of the charge-voltage conversion section; and
a voltage setting section configured to set a voltage of a well of the charge-voltage conversion section to be negative when the reset transistor resets a potential of the charge-voltage conversion section, and wherein the voltage of the well of the charge converting section is set to be greater than a negative voltage after the reset operation and during and after a transfer operation.

* * * * *